United States Patent [19]

Arai et al.

[11] Patent Number: 4,903,267
[45] Date of Patent: Feb. 20, 1990

[54] METHOD OF GENERATING TEST DATA

[75] Inventors: Kiyokazu Arai; Syun Ishiyama, both of Kanagawa, Japan

[73] Assignee: Hitachi, Ltd., Tokyo, Japan

[21] Appl. No.: 126,834

[22] Filed: Nov. 30, 1987

[30] Foreign Application Priority Data

Dec. 1, 1986 [JP] Japan .............................. 61-286290

[51] Int. Cl.⁴ .......................................... G01R 31/28
[52] U.S. Cl. ........................................ 371/27; 371/25
[58] Field of Search ...................... 371/25, 27, 21, 20; 364/200, 900

[56] References Cited

U.S. PATENT DOCUMENTS

| | | | |
|---|---|---|---|
| 4,450,560 | 5/1984 | Conner | 371/27 |
| 4,696,005 | 9/1987 | Millham | 371/27 |
| 4,710,704 | 12/1987 | Ando | 371/25 |
| 4,710,932 | 12/1987 | Hiroshi | 371/27 |
| 4,768,195 | 8/1988 | Stoner | 371/27 |
| 4,775,977 | 10/1988 | Dehara | 371/27 |
| 4,779,273 | 10/1988 | Beacler | 371/27 |

Primary Examiner—Michael R. Fleming
Attorney, Agent, or Firm—Fay, Sharpe, Beall, Fagan, Minnich & McKee

[57] ABSTRACT

The invention prepares test data on a logic LSI which includes a plurality of signal pins, a control pin for inputting an external control signal, and control circuitry responsive to the external control signal for setting the signal pins in a desired state according to a specified function thereof.

In accordance with the invention, the method comprises the steps of storing first data in a first memory, the first data being representative of a specified function of individual pins; storing the second data in a second memory, the second data representing a plurality of pin states corresponding to a plurality of signal states set by the external control signal; reading first and second data from the first and second memory; selectively communicating the test control signal to the integrated circuit, generating third data representative of each pin state of individual pins of each signal state set by the external control signal; and storing the third data into a file as test data.

16 Claims, 7 Drawing Sheets

METHOD OF GENERATING TEST DATA

BACKGROUND OF THE INVENTION

The present invention relates to a method of generating test data for a large scale integrated circuit, and especially it relates to a method of preparing automatically the test data necessary for a direct current characteristic test of each integrated circuit.

In order to improve the testability of logic LSI circuits, a logic LSI family has been realized in recent years which has control input pins that are common in functions and numbers even between different types of circuits. It is a feature of this family that it is provided with a control circuit which can set arbitrary signal pins of said logic LSI in a desired state by setting on said control input pins an external control signal that is uniform between the different types of cirucits. The circuit can thus be tested for the desired state signal pens.

The provision of logic LSI with a control circuit for an improvement in testability is illustrated, for instance, in the LSI catalog of Fairchild Corporation "FGC Series Advanced 2-Micron CMOS Gate Array Family" (December 1984).

In the logic LSI family provided with the control circuit, the state of the signal pins (input, output, and bidirectional pins) can be controlled commonly even between different types of circuits on the basis of the state of control pins. However, specifications of pins (correspondence of pin numbers with input pins, output pins, and bidirectional pins) are different according to each type of circuit even in the present logic LSI families. Therefore, the correspondence of pin numbers with signal pins must be identified before preparation of test data (diagnostic data) on the occasion of a test of the logic LSI, and in particular for a test of the direct-current characteristic thereof. This idenfification is a substantial problem because a designer or a third person has to check the correspondence of the pin numbers with the input, output and bidirectional pins one by one on the basis of the logical construction of the logic LSI concerned, discerning the condition of a given pin to be "H", "L", "indefinite" or the like, for the preparation and taking of the test data.

In the prior art systems, a great deal of such checking is needed to prepare the test data for the logic LSI. As the extent of checking increases with enlargement of the scale of logic, there is an increased possibility of the occurrence of an error in the preparation of the data.

SUMMARY OF THE INVENTION

An object of the present invention is to facilitate and automate the taking of test data on each logic LSI of a logic LSI family which includes a plurality of signal pins, a control pin for inputting an external control signal, and means responsive to the external control signal for setting each signal pin in a desired state according to a specified function thereof.

In accordance with the invention, there is a method provided which comprises the steps of storing first data in a first memory, the first data being representative of a specified function of individual pins; storing second data in a second memory, the second data being representative of a plurality of pin states corresponding to a plurality of pin states corresponding to a plurality of signal states set by external control signal; reading the first and second data from the first and second memory; responsive to the first and second data, generating third data representative of each pin state of individual pins of each signal state set by the external control signal; and storing the third data into a file as test data.

The logical description data are prepared when the logic LSI concerned is manufactured, and pin informations (correspondence of pin numbers with input pins, output pins and bidirectional pins) are contained therein. By combining pin informations in said logical description data with control informations on the control data table, accordingly, test data for said logic LSI can be prepared. Based on the test data thus prepared, "H" or "L" is set on control pins, input pins and bidirectional pins in an input mode of said logic LSI and a test (direct-current test) is applied to output pins and bidirectional pins in an output mode to know if these pins turn to be "H" or "L" as expected.

BRIEF DESCRIPTION OF THE DRAWINGS

The invention may take physical form in certain parts and arrangements of parts which will be described in detail in this specification and illustrated in the accompanying drawings which form a part hereof and wherein.

DESCRIPTION OF THE PREFERRED EMBODIMENT

Figure 5A:
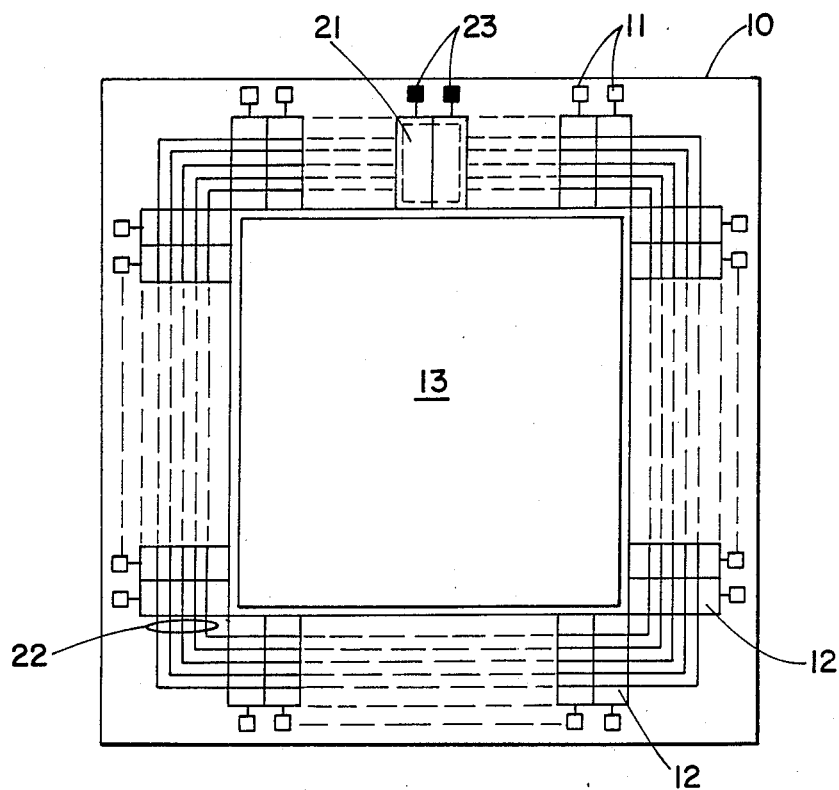
FIG. 5A is a schematic view of a logic LSI chip provided with an input/output pin control circuit.

FIG. 5A shows an example of a construction of a logic LSI circuit device provided with an input/output control circuit in accordance with the present invention.

Numeral 10 denotes an LSI chip, 11 is a bonding pad, and 12 is an input/output buffer element. Numeral 13 denotes an internal region of the chip constituting the logic circuit.

Numeral 23 denotes a bonding pad for a control input pin having a fixed function, 21 is a control circuit for controlling the state of all signal pins of the logic LSI concerned in a manner as will be more fully disclosed below, and 22 denotes the control circuit wiring of the chip. In the present logic LSI, the control circuit and the control circuit wiring are provided in the input/output buffer element 12 (the so-called frame element). This circuit element is commonly provided for the logic LSI family concerned. In other words, the family purposely has a common control circuit construction, although input pin positions (input pin numbers), output pin positions (output pin numbers), etc. are different according to a type of circuit therein.

Figure 5B:
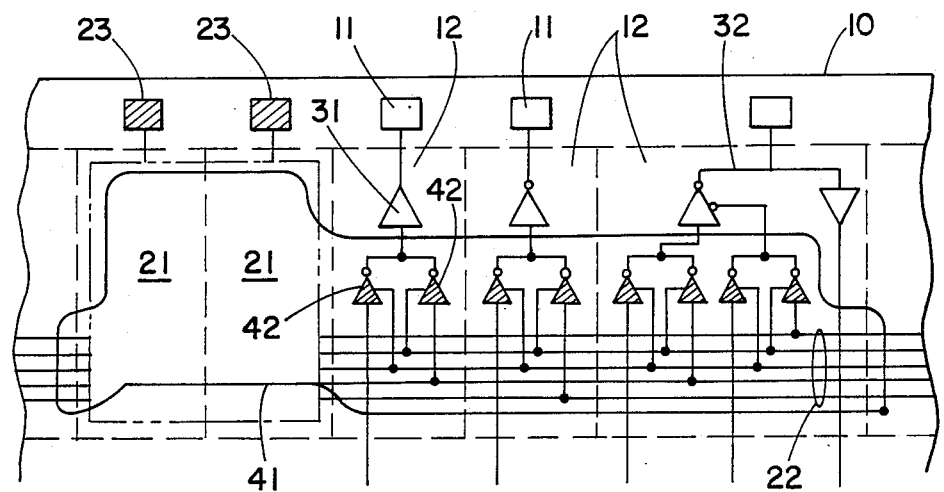
FIG. 5B is a partially enlarged view of the logic LSI chip of FIG. 5A.

FIG. 5B is an enlarged view of a portion of the LSI in FIG. 5A. The portion includes a part 42 of the logic elements of the control circuit 21 that is fixed in the input/output buffer element 12, in addition to the buffer gate 31, in the illustrated logic LSI chip 10. Though omitted in the figure, a driver element is provided in the control circuit 21. In the present logic LSI family, in this way, a control circuit system (noted by the solid line 41) is provided commonly for all input and output pins. In other words, an output buffer gate 31 of this logic LSI family, or a bidirectional buffer gate 32 thereof, is in communication with a common gate 42 that is a part of the control circuit.

The control circuit 21 determines the state of other signal pins on the basis of combinations (data thereon are common to the logic family concerned) of the input state of two control input pins 23 to provide primary and secondary logic signals at the signal pins. For example, when these two pins are both low (L, L) all output pins are "L", and bidirectional pins are also "L" in an output mode. When they are low and high (L, H) respectively, all the output pins are "H", and the bidirectional pins are also "H" in an output mode. When (H,L), all the output pins are "H", while the bidirectional pins turn to be in the input mode. When they are (H, H), the control circuit is separated from all of the signal pins, and the logic LSI is put in a mode of ordinary operation. Preferably H represents a high voltage state, for instance 5.0 volt, as one primary binary signal, and L represents a low voltage state, for instance 0.0 volt, as the other secondary binary signal.

Figure 1:
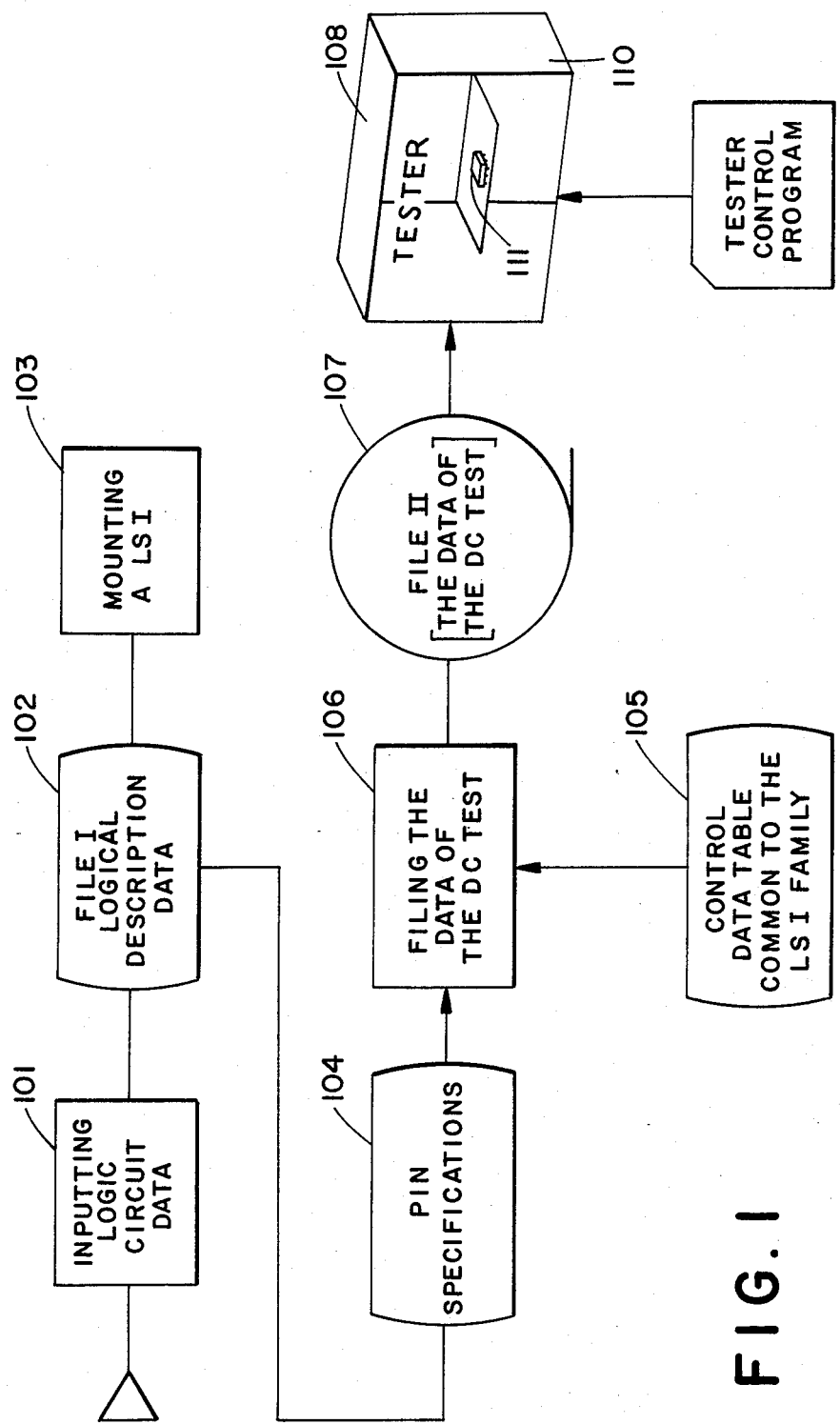
FIG. 1 is an operational flowchart of an embodiment of the present invention.

FIG. 1 is an operational flowchart of one embodiment of the present invention. Logic circuit identifying data of an LSI to be tested is inputted (step 101), so as to produce logical description data defining the logic circuit of said logic LSI (step 102). The LSI has been manufactured in accordance with said logical description data (step 103). For the occasion of the test, the logical description data is filed to be stored. More particularly, since pin position identifications of the logic LSI are contained in the logical description data, specifications of the pertinent pins are obtained from the filed logical description data when a direct-current characteristic test (DC test) of the logic LSI is conducted. This information on pin specifications and a test control data table common to the given LSI family are inputted to a personal computer or the like (steps 104 and 105), and the condition according to "H", "L", "indefinite", etc. is determined for each signal pin on the basis of the specification thereof (as to whether it is an input pin, an output pin, or a bidirectional) and the control information of the control data table, so as to prepare and file the data for the DC test (steps 106 and 107). The test is performed in such a manner that the logic LSI 111 to be tested is set in an automatic tester 110, test control data is inputted from the file and a tester control program is made to run. The tester control program is employed for starting the tester 110 and prescribing test limit values and running the test.

Figure 3:
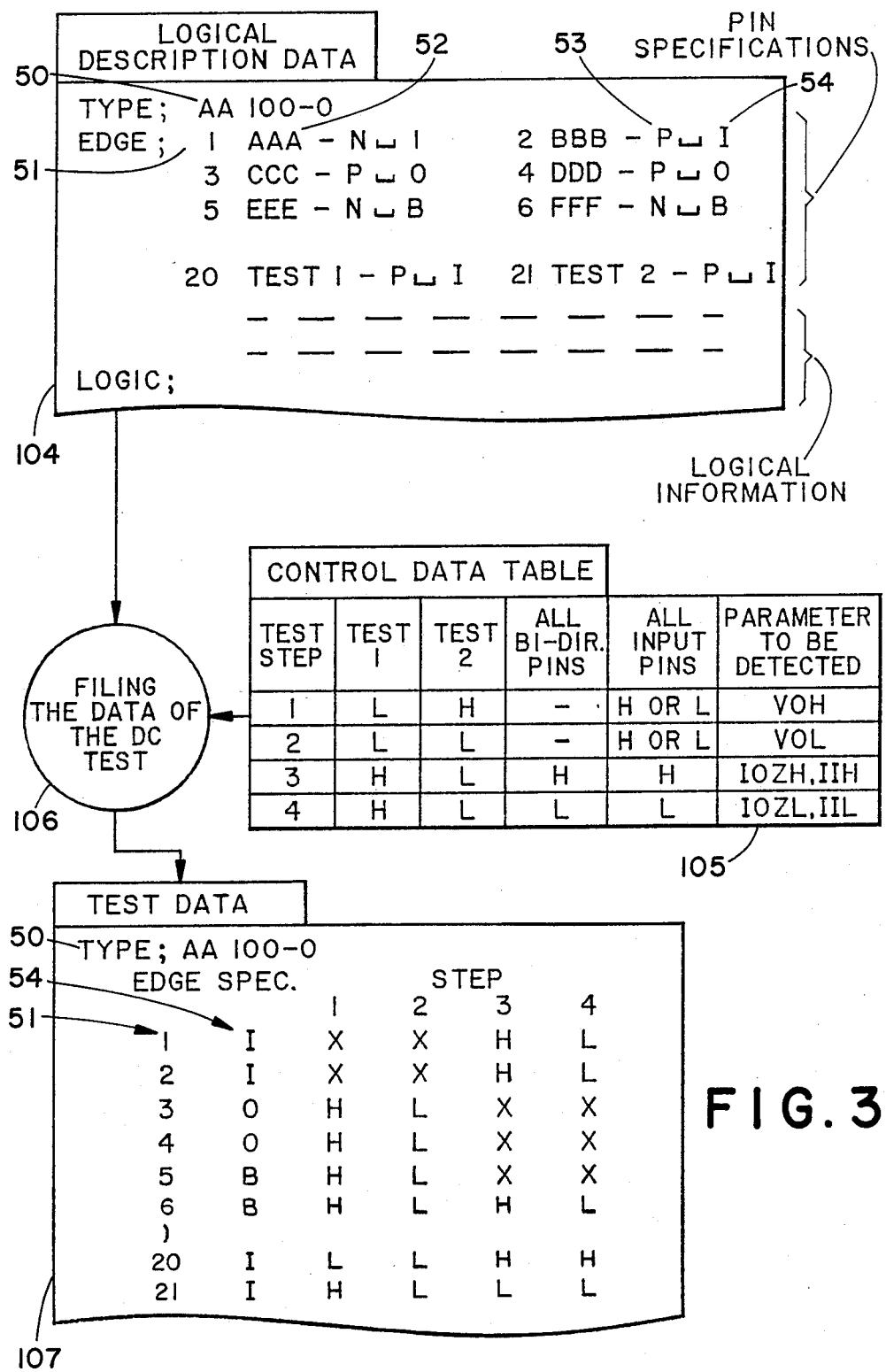
FIG. 3 is a format of logical description data, a control data table and a test data.

FIG. 3 shows a format of a logical description data for identifying the circuit and signal pin positions, a control data table for running a test and a test data resultant from the test.

More particularly, the "logical description data" 104 is illustrated to comprise data for identifying the subject LSI, and pin information (such as those on correspondence of numbered pins with input pins or output pins). In the format of the logical description data, numeral 50 denotes LSI family type, numeral 51 designates pin numbers, numeral 52 denotes pin names, numeral 53 denotes pole natures (positive (P) or negative (N)) and numeral 54 denotes pin specifications (input (I), output (O), or bidirectional (B)).

In the present example, the first and second pins represent input pins (I), the third and fourth pins, output pins (O), the fifth and sixth pins bidirectional pins (B), and twentieth and twenty-first pins test control input pins.

With reference to the "control data table" 105, the direct-current characteristics of the individual signal pins of the LSI to be tested are put in a testing state which is defined by the table. The table definiations are common to the logic LSI family concerned by the combination of H/L of the control input pins (the twentieth and twenty-first pins in the present example).

In the first test step, the Test 1 pin and the Test 2 pin are supplied L and H level signals, respectively, and all input pins are supplied H or L level signals. In this step, the high level voltage (VOH) of output pins is tested by the tester.

In the second test step, the Test 1 pin and the Test 2 pin are supplied L and L level signals, respectively and all input pins are supplied H or L level signals. In this step, the low level voltage (VOL) of output pins is tested by the tester.

In the third test step, the Test 1 pin and the Test 2 pin are supplied H and L level signals, respectively, and all bidirectional pins and all input pin are supplied high level signals. In this step, the input current of the bidirectional pins (IOZH) and the input pins (IIH) are tested by the tester.

In the fourth test step, the Test 1 pin and the Test 2 pin are supplied H and L level signals, respectively, and all bidirectional pins and all input pins are supplied low level signals. In this step, the input current of the bidirectional pins (IOZL) and the input pins (IIL) are tested. "Test data" 107 is prepared by combining the logical description data 104 and the control data table 105 together. The "test data" 107 prepared herein is data on the state of either "H" or "L" of the control input pins and the other signal pins, which are prepared in each step.

Figure 6:
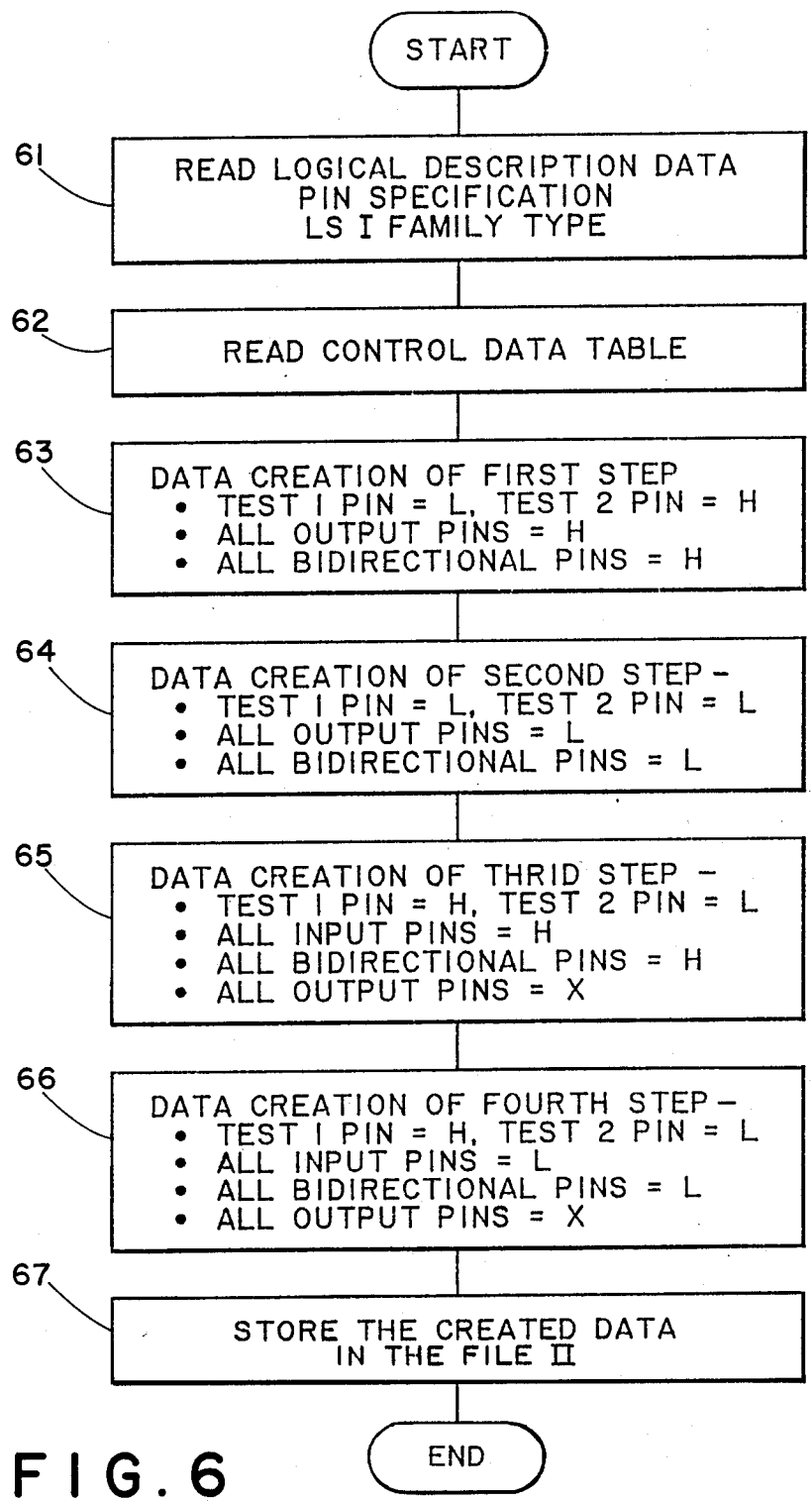
FIG. 6 is a detailed flow chart of the step for filing the data of the DC test in accordance with the FIG. 1 embodiment; and, FIG. 7 is a detailed flow chart of the step for filing the data of the DC test in accordance with the FIG. 2 embodiment.

FIG. 6 is a detailed flowchart of the filing step 106 of FIG. 3. In the step 61, the personal computer (not shown and it is intended that any other suitable processor may likewise be employed) reads the logical description data, especially pin specifications and LSI family type, from the File I (Step 102 of FIG. 1).

In the step 62, the personal computer also reads the control data table common to the LSI family in response to the LSI family type.

In the step 63, the personal computer generates the first signal data to be used for first step test, based on the logical description data and the control data table. The first data designates the H and L level signal should be supplied to Test 1 pin and Test 2 pin respectively, and H level signal should appear at all out pins and all bidirectional pins.

In the step 64, the personal computer generates second signal data to be used for the second step test based on the logical description data and the control data table. The second data designates that L level signal should be supplied to Test 1 pin and Test 2 pin and L level should appear at all output pins and all bidirectional pins.

In step 65, the personal computer generates third signal data to be used for the third step test based on the logical description data and the control data table. The third data designates that H and L level signal should be supplied to Test 1 pin and Test 2 pin, respectively, and an H level signal is supplied to all input pins and all bidirectional pins. The output pins are not tested.

In step 66, the personal computer generates fourth signal data to be used for the fourth step test based on the logical description data and the control data table. The fourth data designates that L level signal should be supplied to Test 1 pin and Test 2 pin, L level signal should be supplied to all input pins and all bidirectional pins. The output pins are not tested.

In step 67, the personal computer stores the first, second, third, and fourth data in the file II (Step 107 of FIG. 1).

Figure 2:
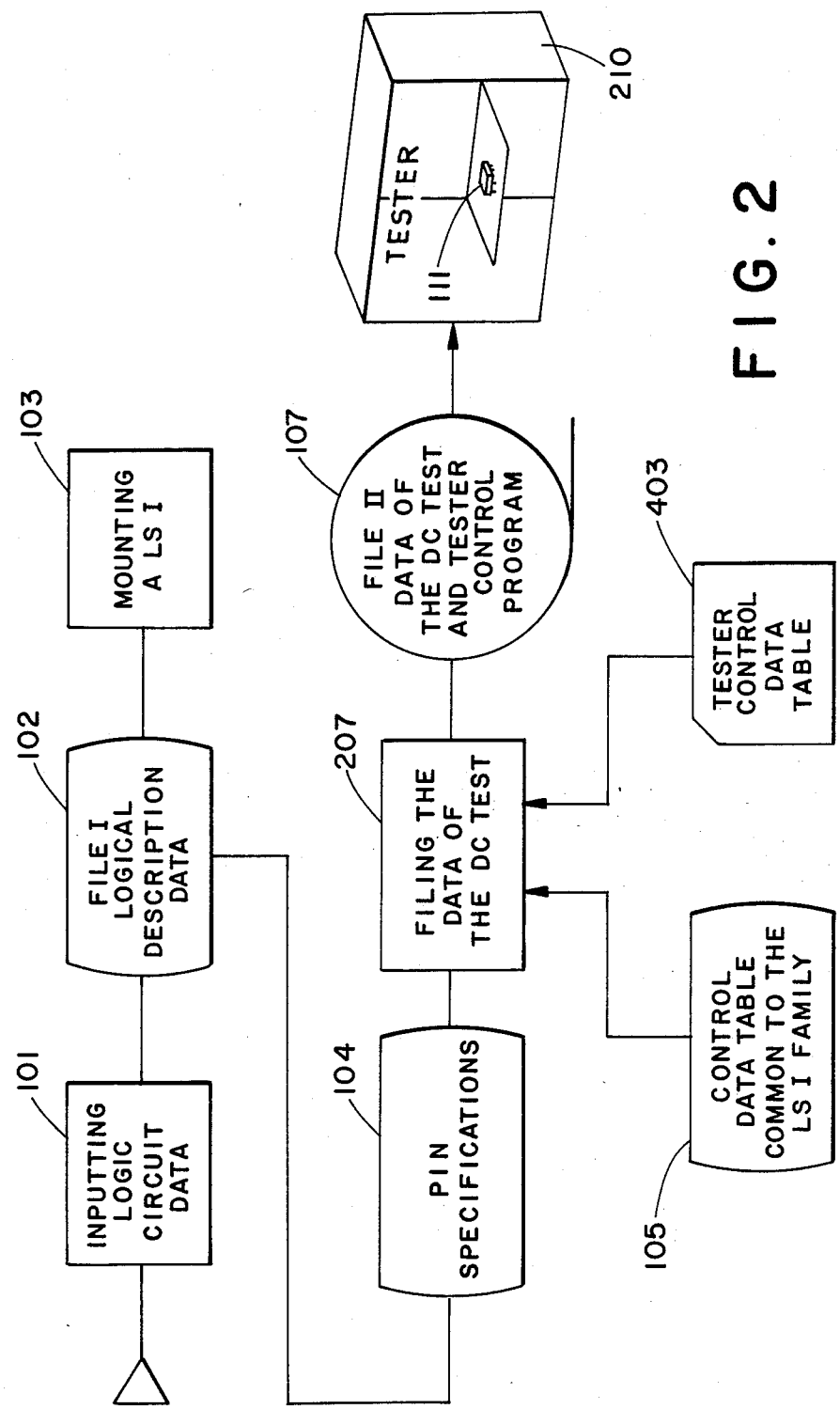
FIG. 2 is an operational flowchart of another embodiment of the present invention.

FIG. 2 is an operational flowchart of another embodiment of the present invention, and this chart differs from that of FIG. 1 in that a control data table for a tester is combined additionally with the combination of individual pin specification information for the given logic LSI and a control data table common to the logic LSI family. This allows "data for DC test + tester control program".

Figure 4:
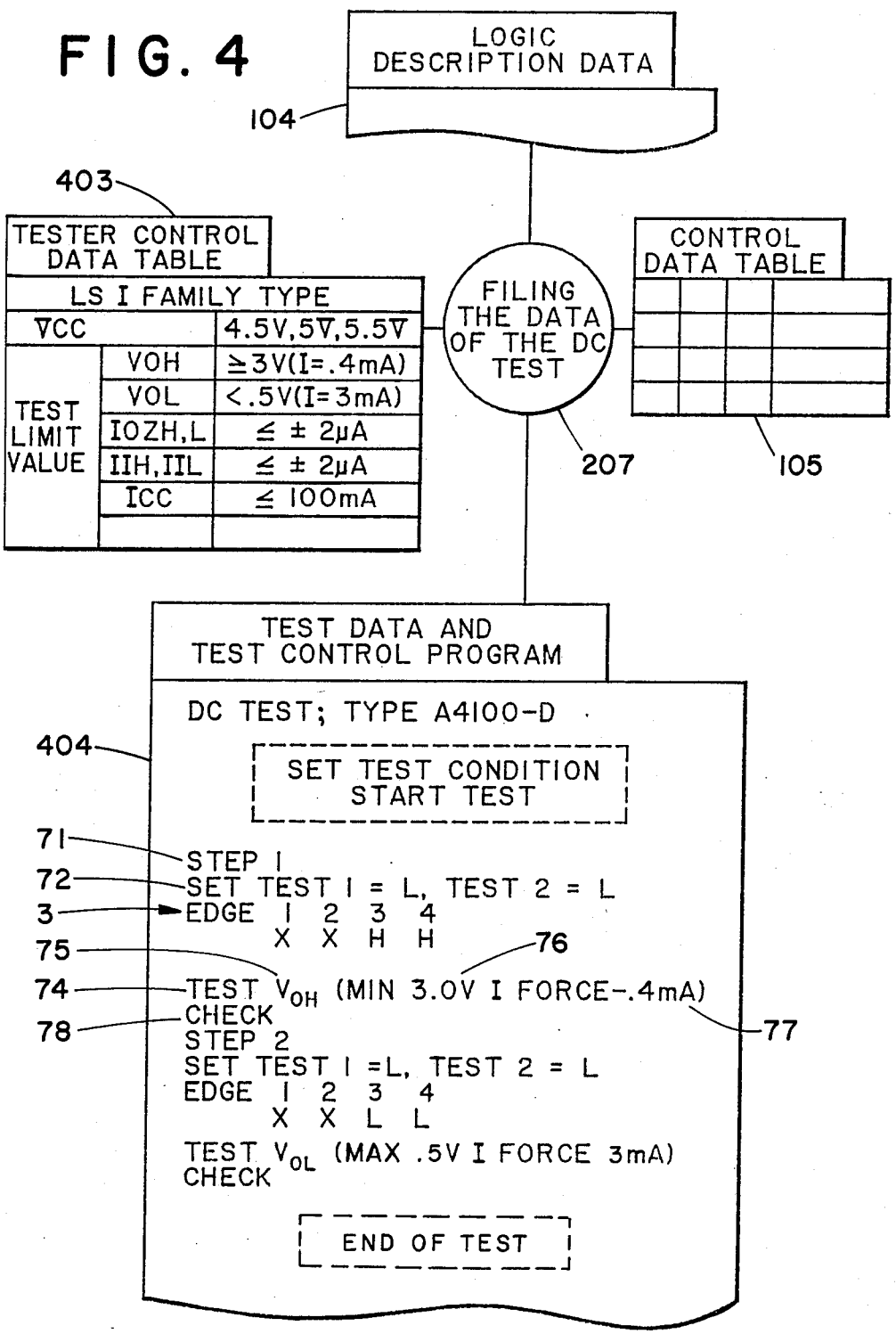
FIG. 4 is a format of a tester control data table and a test data plus tester control program.

A concrete example of preparation corresponding to the embodiment of FIG. 2 is shown in FIG. 4. In FIG. 4, the "logical description data" 104 and a "control data table" 105 are the same as in FIG. 3. In this example, a "tester control data table" 107 is also combined with the data 104 and table 105 to prepare a "test data + tester control program" 404.

In the "tester control data table" 403, LSI family type, a power supply set value Vcc and a test limit value of each direct-current parameter are defined as a table. For example, the table 403 defines that VOH (a high output voltage of an output pin) must be over 3.0 volts when the current of the output pin is −0.4 mA, VOL (a low output voltage of an output pin) must be under 0.5 volts when the current of the output pin is 3 mA, absolute values of IOZH and IOZL which are the currents of a bidirectional pin when H and L level signals are supplied, respectively, must be under 2 uA and Icc (the current of the power supply) must be under 100 mA.

Beginning with setting of test conditions and an instruction of starting a tester, the DC parameter test data (data on H and L of numbered pins), test limit values, an instruction of processing after testing, etc. are programmed in the "test data + tester control program" 404.

In the "test data + tester control program" 404, numeral 71 denotes a number of the test step, numeral 72 denotes "SET" instruction that instructs to supply L and H level signal with TEST 1 pin and TEST 2 pin respectively, and numeral 73 denotes "EDGE" instruction that instructs which pins should be tested (in this case pin number 3 and 4 should be tested). Numeral 73 denotes "TEST" instruction which instructs to measure voltage or current of pins instructed by "EDGE" instruction. In this case, VOH is placed next to the "TEST" instruction. It means voltage should be measured. The "TEST" instruction also includes information (46, 47), one of which is limit value 46 and the other is the current of the pins instructed by the "EDGE" instruction. Numeral 78 denotes "CHECK" instruction that instructs to check whether the measured voltage or current is over the limit value 46.

Figure 7:
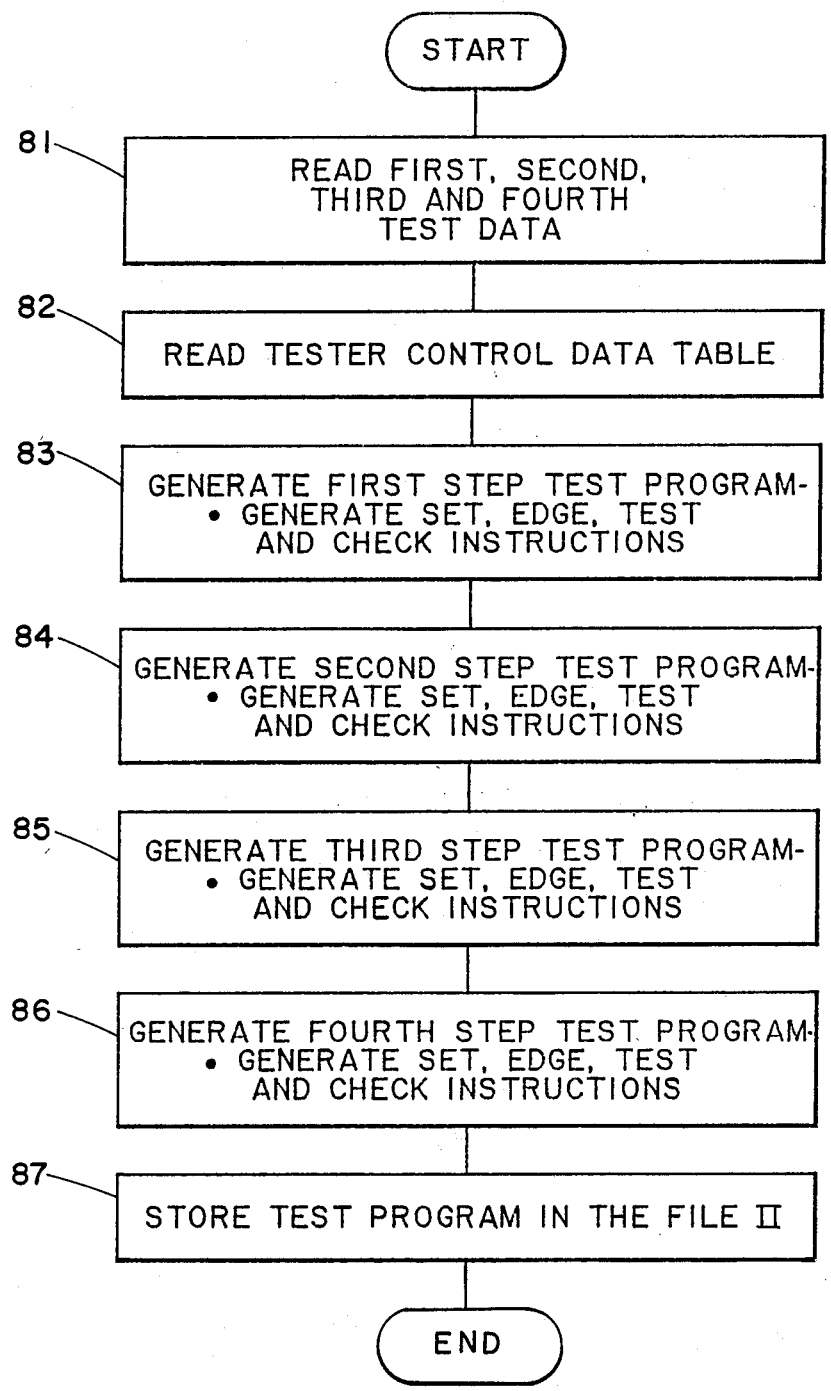

FIG. 7 is a detailed flowchart of the step 207. In the step 81, the personal computer reads the first, second, third, and fourth test data from the file II.

In step 82, the personal computer reads the tester control data table.

In step 83, the personal computer generates the first step test program. In this step, the personal computer generates "SET" instructions based on the first test data, generates the "EDGE" instructions based on the first test data, generates "TEST" instructions based on the "TEST DATA + TESTER CONTROL DATA TABLE" 403, and finally, generates "CHECK" instruction.

The steps 84 and 86 are similar to the step 83.

In the step 87, the generated test programs are stored in the file II.

The tester performs the first step test as follows:
(1) supplying L and H level signal to Test 1 pin and Test 2 pin respectively;
(2) supplying 0.4 mA current with output pins which are instructed by the program;
(3) measuring output voltage of the output pins; and,
(4) checking whether the measured voltage is over 3.0V.

The other step tests are performed in the same manner as the first step test was.

According to the construction of FIG. 2, the LSI 111 to be tested is tested without preparing any separate control program for the tester side, by applying said "test data + tester control program" directly to a tester 210.

According to the present invention, the taking of test data for an LSI chip reduces the man power and steps necessary for a direct-current test to test the characteristics of large-scale logic integrated circuits. The invention is applicable to many types of such circuits of the same family type. The circuits are tested by an automatic tester, and moreover, a logic designer is not required to recognize a control circuit for testing, thus turning him free from work otherwise necessary in respect to both a logic design and the preparation of the test data.

Since specifications of pins differ according to the types of circuits, the specifications are taken from logic circuit data and, moreover, since signals given to control input pins are common to a family, the possibilities of a mistake occurring in the taking of operating data, and number of steps are reduced.

Thus, a great number of designing processes, as well as test data debugging processes, can be reduced according to the present invention.

What is claimed is:

1. A method of generating operating test data for an integrated circuit having a plurality of signal pins having functions of input, output or input/output, a plurality of control pins for inputting an external test control signal, and means responsive to the external control signal for selectively setting each signal pin in a desired state, the method being applied to a test device having a first memory, a second memory, and a file, the method comprising the steps of:
   storing first data in the first memory, the first data being representative of the specific function of each individual signal pin;
   storing second data in the second memory, the second data being respresentative of a plurality of pin states corresponding to a plurality of signal states of the external test control signal, each pin state being predetermined in accordance with its pin function;

reading the first and second data from the first and second memory;

selectively communicating said external test control signal to the integrated circuit to be tested;

generating third data representative of each pin state of signal pins of the integrated circuit to be tested corresponding to each signal state of the external test control signal; and storing the third data into a file as test data.

2. The method of claim 1 wherein the signal pin includes an output pin, and wherein the generating step includes the step of producing data representative of which signal pin outputs a primary logic signal in an event when the external control signal is at a first state.

3. The method of claim 2 wherein the generating step includes the step of producing data representative of which signal pin outputs a secondary logic signal in an event when the external control signal is at a second state different from the first state.

4. The method of claim 3 wherein the signal pin includes an input pin, and wherein the generating step includes the step of producing data representative of which signal pin receives a logic signal in an event when the external control signal is at a third state different from the first and second state.

5. The method of claim 4 wherein the generating step includes the step of producing data representative of which signal pin receives a remaining logic signal in an event when the external control signal is at the third state.

6. The method of claim 5 wherein the method includes the steps of:

reading the third data from the file;

supplying the control pin with the first state external control signal;

measuring voltage of the signal pin designated by the third data as that outputting the primary logic level; and comparing the voltage of the signal pin with a predetermined limit value to determine acceptability of the integrated circuit.

7. The method of claim 5 wherein the method includes the steps of:

reading the third data from the file;

supplying the control pin with the second state external control signal;

measuring voltage of the signal pin designated by the third data as that outputting the secondary logic level; and comparing the voltage of the signal pin with a predetermined limit value to determine acceptability of the integrated circuit.

8. The method of claim 5 wherein the method includes the steps of:

reading the third data from the file;

supplying the one logic signal to signal pin designated by the third data as that to be supplied therewith;

measuring current at the signal pin designated by the third data; and comparing the current with a predetermined limit value so as to determine acceptability of the integrated circuit.

9. An apparatus for generating test data for an integrated circuit having a plurality of signal pins having functions of input, output or input/output, a plurality of control pins for inputting an external control signal, and means responsive to the external control signal for selectively setting each signal pin in a desired state according to a specified function thereof, the apparatus comprising:

a first memory adapted for storing first data representative of the specified function of each individual pin;

a second memory adapted for storing second data representative of a plurality of pin states corresponding to a plurality of signal states of the external control signal, each pin state being predetermined in accordance with its pin function;

means for reading the first and second data from the first and second memory respectively;

means for selectively communicating the external test control signal to the integrated circuit to be tested;

means responsive to the first and second data for generating third data which represents each pin state of signal pins of the integrated circuit to be tested corresponding to each signal state of the external control signal; and file means for storing the third data as a test data.

10. The apparatus of claim 9 wherein the apparatus further comprises:

means for reading the third data from the file means;

means for supplying the control pin with a first state external control signal;

means for measuring voltage of at least one of the signal pins designated by the third data as that outputting the one of logical level; and means for comparing the voltage of the signal pin with a predetermined limit value to determine acceptability of the integrated circuit.

11. The apparatus of claim 9 wherein the apparatus further comprises:

means for reading the third data from the file means;

means for supplying a logic signal to a signal pin designated by the third data as that which is to be supplied the level;

means for measuring current of the signal pin designated by the third data; and means for comparing the current with a predetermined value to determine acceptability of the integrated circuit.

12. A method of generating test data for an integrated circuit having a signal pin, a control pin for inputting an external control signal for setting each signal pin in a desired state according to a specified function thereof, the method being applied to a test device having a first memory, a second memory, a third memory, and a file, the method comprising the steps of:

storing first data in a first memory, the first data representing specifications of individual pins;

storing second data in a second memory, the second data respresenting a plurality of pin states corresponding to a plurality of signal states of the external control signal;

storing third data in a third memory, the third data representing an electrical limit value of the integrated circuit;

reading the first and second data from the first and second memory respectively;

responsive to the first and second data, generating fourth data by means of the test device representative of each pin state of the signal pins of the integrated circuit to be tested corresponding to each signal state of the external test control signal;

reading the third data from the third memory;

responsive to the third and fourth data, producing fifth data by means of the test device which represents each pin state of individual signal pins and electrical limit values of the pin in each signal state of the external control signal; and storing the fifth data into a file as a test data.

13. The method of claim 12 wherein the generating step includes the step of generating sixth data representative of desired signal pin output when the external control signal is at a first state.

14. The method of claim 13 wherein the producing step includes the step of producing data representative of a desired voltage limit of the pin designated by the sixth data.

15. The method of claim 12 wherein the generating step includes the step of generating seventh data representative of which signal pin is to be supplied a logic level when a signal state of the external control signal is at a second state.

16. The method of claim 15 wherein the producing step includes the step of producing data representative of a limit current to be supplied to the signal pin designated by the seventh data.

* * * * *